(12) United States Patent
He et al.

(10) Patent No.: US 8,198,949 B2
(45) Date of Patent: Jun. 12, 2012

(54) DIGITAL MODULATOR

(75) Inventors: Xin He, Waalre (NL); Jan Van Sinderen, Liempde (NL); Manuel Collados Asensio, Larkfield (NL); Nenad Pavlovic, Eindhoven (NL)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/001,894

(22) PCT Filed: Jul. 1, 2009

(86) PCT No.: PCT/EP2009/058282
§ 371 (c)(1),
(2), (4) Date: Mar. 22, 2011

(87) PCT Pub. No.: WO2010/003864
PCT Pub. Date: Jan. 14, 2010

(65) Prior Publication Data
US 2011/0261914 A1    Oct. 27, 2011

(30) Foreign Application Priority Data
Jul. 7, 2008    (EP) ...................................... 08159820

(51) Int. Cl.
*H03C 3/00* (2006.01)
*H04L 27/00* (2006.01)
*H04L 27/04* (2006.01)
*H04L 27/12* (2006.01)
*H04L 27/20* (2006.01)

(52) U.S. Cl. ..................... 332/100; 332/103; 375/295

(58) Field of Classification Search .......... 332/100–105; 375/295, 300, 302
See application file for complete search history.

(56) References Cited

U.S. PATENT DOCUMENTS

| | | | |
|---|---|---|---|
| 5,157,693 A * | 10/1992 | Lemersal et al. | 375/308 |
| 6,370,372 B1 | 4/2002 | Molnar | |
| 7,085,548 B1 | 8/2006 | Kluge | |
| 7,164,328 B2 | 1/2007 | Yuan et al. | |

FOREIGN PATENT DOCUMENTS

| | | |
|---|---|---|
| EP | 0471968 A | 2/1992 |
| WO | 2005076464 A1 | 8/2005 |

* cited by examiner

*Primary Examiner* — David Mis
(74) *Attorney, Agent, or Firm* — Coats & Bennett, P.L.L.C.

(57) ABSTRACT

The present application relates to a digital modulator comprising an output stage comprising a number of unit cell arrays, and a sampling stage. The present application relates also to a communication device comprising said digital modulator, a method for digitally modulating and a computer program product. More particularly, the digital modulator comprises an output stage comprising a number of unit cell arrays, wherein the output stage comprises at least one carrier frequency signal input terminal configured to receive a carrier frequency signal. The digital modulator comprises a sampling stage connectable to the output stage, wherein the sampling stage is configured to oversample at least one data input signal. The digital modulator comprises at least one sampling clock generating device configured to generate at least one sampling clock signal depending on the number of arranged unit cell arrays and the carrier frequency signal.

17 Claims, 4 Drawing Sheets

DIGITAL MODULATOR

TECHNICAL FIELD

The present application relates to a digital modulator comprising an output stage which comprises a number of unit cell arrays, and a sampling stage. The present application relates also to a communication device comprising said digital modulator, a method for digitally modulating and a computer program product.

BACKGROUND

In general, for improving the data rate in communication devices, in particular wireless communication devices, modulation types with non-constant envelopes can be used. However, problems may arise by using high efficient amplifiers for amplifying the signal being transmitted to a suitable transmit power due to the non-constant envelope of the signal.

In FIG. 1, a conventional inphase/quadrature (IQ) transmitter is shown. As can be seen from FIG. 1, one input signal may be the inphase component 2, which can be processed by a digital analogue converter (DAC) 6. In a similar way, as a second input signal, the quadrature component 4 can be processed. Both inphase component 2 and quadrature component 4 can be generated by a suitable signal generator, like a digital signal processor (DSP) or the like (not shown). After passing the low pass filters 8, inphase component 2 can be mixed with a first local oscillator (LO) signal 10 for up converting as well as the quadrature component 4 can be mixed with a second LO signal 12 for up converting. The first LO signal may differ from the second LO signal in a phase shift of ninety degree. Subsequently, the resulting signals can be combined and fed to a programmable gain amplifier (PGA) 14 and to a suitable external power amplifier (PA) 16.

However, such an IQ transmitter has merely a limited signal bandwidth due to the inaccuracy of the provided DACs 6. Another drawback is the large required chip area consumed by the low pass filters 8. Furthermore, complex calibration is needed to set the right corner of the low pass filters 8 in a CMOS process.

A low pass filter can be omitted by implementing a direct digital radio frequency RF modulator instead of the above-proposed IQ transmitter. One possibility is to employ a linear interpolation current-steering DAC to generate base band current signals, which can drive the mixing device directly. For alleviating the still existent problem of limited bandwidth, the DAC and the up conversion mixer can be combined, since the DAC is responsible for the limited bandwidth. Such a modulator device may comprise an array of unit cells driven by a quadrature LO signal and digital IQ data. Another kind of suitable digital RF modulators with a higher power efficiency compared to the previous stated modulators is a digitally envelope-modulated RF modulator. In this modulator, envelope information and phase information can be combined at the RF output.

All the previous stated solutions of prior art comprise the drawback of introduced images or spurs nearby the carrier frequency with offset of the sampling clock frequency and higher order harmonics due to discrete-time to continuous-time conversion. These may violate the spectral mask and the constraints on out-of-band emissions. According to prior art, these undesired spurs can be prevented by filtering the output of the PA. However, extra LC tank and LC resonating circuit respectively as well as frequency tuning and a large chip area are required. Another possibility according to prior art is to increase the sampling frequency and interpolating the input as shown in FIG. 2.

In FIG. 2, a number of unit cell arrays 20 are arranged as an output circuit or output stage each connected to sampling devices 22 via lines 28 and 30. For up converting a data input signal onto a carrier frequency, each unit cell array 20 is supplied with a local oscillator signal or carrier frequency signal via input terminal 18. Oversampling and folding of the data input signal received via terminals 26 can be performed by the unit cell arrays 20 and sampling devices 22. The sampling devices 22 can be supplied with sampling clock signals via terminals 24.1 to 24.4. In the present case, the sampling clock signals applied at the different terminals 24.1 to 24.4 differs in their phase shift. The sampling clock signal is chosen as N times the bandwidth of the base band signal for easy signal processing. Thereby, N is the number of folds used for interpolation or the number of arranged unit cell arrays 20.

However, such a system does not suppress spurs at the offset of ±N, ±2N, ±3N, .... While the spurs at the positive offset can be attenuated in a simple manner, in real implementation issues arise due to back folding from the negative complex domain into the real frequency domain. In other words, a spur is caused by folding back the image aliasing from negative frequency offset to a frequency value nearby the carrier frequency. According to prior art, a so called SAW filter can be employed for suppressing these spurs nearby the carrier frequency, which requires a great chip area and its production is connected with high costs.

Additionally, the above stated spurs yield to issues, in case a combination of a transmitter and receiver, which claim different bands, are employed within a communication device. For example, in an application, which uses a Bluetooth transmitter (2.4-2.5 GHz) and a Global System for Mobile Communications (GSM) receiver (1.8-1.9 GHz) simultaneously, the spurs generated by the transmitters may cause undesired peak spurs within the receiver band.

Therefore, it is an object of the present application to provide a digital modulator which prevents undesired spurs nearby the carrier frequency. Another object is to reduce the required chip area of the digital modulator. A further object is to provide a digital modulator which can be produced with reduced costs. Another object is to avoid the implementation of a SAW filter. A further object is to prevent undesired spurs for simultaneously operated different bands.

SUMMARY

These and other objects are solved by a digital modulator, comprising an output stage. The output stage comprises a number of unit cell arrays, wherein the output stage comprises at least one carrier frequency signal input terminal configured to receive a carrier frequency signal. The digital modulator comprises a sampling stage connectable to the output stage, wherein the sampling stage is configured to oversample at least one data input signal. The digital modulator comprises at least one sampling clock generating device configured to generate at least one sampling clock signal depending on the number of arranged unit cell arrays and the carrier frequency signal.

According to the present application, a digital modulator, in particular a direct digital RF modulator is provided. Such a digital modulator can be employed in a transmitting apparatus for transmitting information. The present digital modulator comprises an output stage with a number of unit cell arrays. At least two unit cell arrays may be arranged for interpolating, in particular, N-fold linear interpolation. A unit cell array may comprise at least two unit cells, in particular, a plurality of unit cells. The output stage may comprise an output terminal, which can be connected to further components, like an amplifying unit, antenna element or the like.

In addition, the output stage may be configured for up converting a data input signal, like a digital signal. In particular, each unit cell array can be configured to up covert a data input signal onto a suitable and desired carrier frequency. The output stage comprises at least one carrier frequency signal input terminal for receiving a carrier frequency signal. This carrier frequency signal can be generated by a suitable signal generator, like a voltage controlled oscillator (VCO) or the like.

Moreover, a sampling stage is arranged, which is connectable to the output stage. The sampling stage is configured to oversample at least one data input signal. The sampling stage may comprise an input terminal for receiving a data input signal, like digital data generated by a DSP. Furthermore, interpolation combined with oversampling causes that some unwanted spurs can be suppressed. For oversampling, the sampling stage can be supplied with a sampling clock signal or sampling frequency signal.

Contrary to expectation, it is found according to the present application that the generation of undesired spurs, especially nearby the carrier frequency, can be prevented securely, by implementing at least one sampling clock generating device configured to generate at least one sampling clock signal depending on the number of arranged unit cell arrays and the carrier frequency signal. In particular, it is found that correlation between the carrier frequency signal and the number of arranged unit cell arrays, or in other word, the folding factor, can be used for ensuring that no significant peak spurs occur nearby the carrier frequency.

The present application provides for a digital modulator, which prevents significant spurs nearby the carrier frequency in a simple manner, and which requires little chip area. Furthermore, a SAW filter or other additional components can be omitted resulting in a cost-efficient design of the present digital modulator.

According to another embodiment of the present application, the unit cell arrays can be arranged in the output stage in parallel to each other. Interpolation can be performed easily, and in addition, a simple configuration of the output stage of the present digital modulator is provided.

Furthermore, the sampling stage may comprise according to a further embodiment of the present application sampling devices, wherein each sampling device can be connected to one of the unit cell arrays. The unit cell arrays can be easily driven via the sampling devices. Furthermore, such an arrangement enables to switch the unit cell arrays sequentially.

Furthermore, the sampling device can be formed as a decoding device. Since the unit cell array may comprise a plurality of unit cells, suitable driving signals are required. According to the present application, a decoder can be used, since it may be in particular suitable for oversampling and generating suitable output signals to be processed by the output device. More particularly, a binary to thermometer decoder can be used advantageously. Such a binary to thermometer decoder may be used to convert the binary coded input digital word into a thermometer coded digital word. A thermometer coded word may be in particular suitable for driving a unit cell array.

For deriving a suitable sampling clock signal from the carrier frequency signal depending on the number of arranged unit cell arrays, the sampling clock generating device can be formed as a dividing device according to another embodiment of the present application. Such a dividing device can be easily implemented within the digital modulator. According to another embodiment, the sampling clock generating device may comprise at least one dividing factor. In particular, the dividing factor may depend on the number of arranged unit cell arrays. In a simple manner, a correlation between the number of arranged unit cells and the carrier frequency signal is provided.

It is further found, according to the present application that the dividing factor of the sampling clock generating device may be the number of arranged unit cell arrays or half the number of arranged unit cell arrays. In particular, the dividing factor can be determined as half the number of arranged unit cell arrays, in case the number of arranged unit cell arrays is an even number. A divider with a dividing factor being half the number or the number of arranged unit cell arrays can be easily implemented.

What is more, the sampling clock generating device may comprise at least one phase shifting unit. The phase shifting unit may be configured to generate sampling clock signals comprising a phase shift depending on the ratio of 360 degree and the number of arranged unit cell arrays. The phase shifting device can be provided for sequentially switching the unit cell arrays, in particular by N phase-shifted sampling clock signals. By way of example, in case four unit cell arrays are arranged (N=4), the first sampling clock signal may have a phase shift of zero degree, the next sampling clock signal may have a phase shift of ninety degree and so on. It shall be understood that merely one phase shifting unit can be arranged for generating all phase shifts as well as more than one phase shifting unit, such as one phase shifting unit for each generated sampling clock signal having a different phase shift, can be provided.

According to another embodiment of the present application, the unit cell array may comprises N×N unit cells. Each unit cell may be configured to up convert a suitable digital input signal. The unit cells can be arranged in N columns and N rows. It may be also possible, according to further variants of the present application that M×N unit cells are arranged within the unit cell array. The unit cell arrays can each be driven by corresponding sampling devices via at least one line for the rows and at least one further line for the columns. Direct digital modulating is enabled in an easy and efficient manner.

The digital modulator according to another embodiment of the present application can be implemented in CMOS technology, bipolar technology, BiCMOS technology, GaAs, discrete device and/or a combination of them. For example, the CMOS technology can be used, since the required chip space may be low. However, according to different system requirements, the implementation of the digital modulator in other technologies may be also suitable.

Another aspect of the present application is a communication device comprising the digital modulator stated above. The communication device may be any wireless communication device.

According to a further embodiment of the present application, the communication device may further comprise at least one receiving device. For a bilateral communication between two entities, a receiving device can be arranged additional to the transmitter having the digital modulator. According to further variants of the present application, the communication device may comprise more than one receiving device as well as more than one transmitting device, wherein at least one of the transmitting devices comprise the digital modulator according to the present application. For instance, in each case a transmitter and receiver can be provided for Bluetooth, GSM, WiMax and the like in one communication device.

According to the present application, it is further found that a number of arranged unit cell arrays of the digital modulator may depend on at least one predefined criterion for preventing undesired spurs. According to a further embodiment, the at least one predefined criterion may be the band used by the at least one receiving device and/or the band used by the at least one digital modulator. In particular, the criterion may be both the band of the receiving device and the band of the digital modulator. Depending on the used bands, like the different bands for Bluetooth, GSM or WiMax, spurs can be generated by the digital modulator and may be located within a receiver band. In particular, if a transmitter and receiver, which have different bands, are operated simultaneously, undesired spurs in the receiver band can be avoided by choosing the number of arranged unit cells in dependence of the used bands.

A further aspect of the present application is a method for digitally modulating, comprising receiving at least two data input signals, oversampling the data input signals using at least two sampling clock signals, interpolating the oversampled signals by a number of unit cell arrays arranged within an output stage, up converting the oversampled signals by the output stage using a carrier frequency signal, and generating the sampling clock signals depending on the carrier frequency signal and the number of arranged unit cell arrays.

Another aspect of the present application is a computer readable medium having a computer program stored thereon, the computer program comprising instructions operable to cause a processor to perform a method as stated above.

The digital modulator according to the present application can be employed in several communication devices, such as mobile phones and other wireless communication devices. In particular, the digital modulator can be used in Software Defined Radio (SDR) transmitters, which may cover both narrow band and wide band applications, such as Enhanced Data Rates for GSM Evolution (EDGE), Wideband Code Division Multiple Access (WCDMA), Worldwide Interoperability for Microwave Access (WiMax), Long Term Evolution (LTE) and the like.

These and other aspects of the present patent application become apparent from and will be elucidated with reference to the following Figures. The features of the present application and of its exemplary embodiments as presented above are understood to be disclosed also in all possible combinations with each other.

BRIEF DESCRIPTION OF THE DRAWINGS

In the Figures show.

Like reference numerals in different Figures indicate like elements.

DETAILED DESCRIPTION OF THE DRAWINGS

In the following detailed description of the present application, exemplary embodiments of the present application will describe and point out a digital modulator, which prevents undesired spurs nearby the carrier frequency without the need of an implementation of further expensive components, like a SAW filter.

Figure 1:
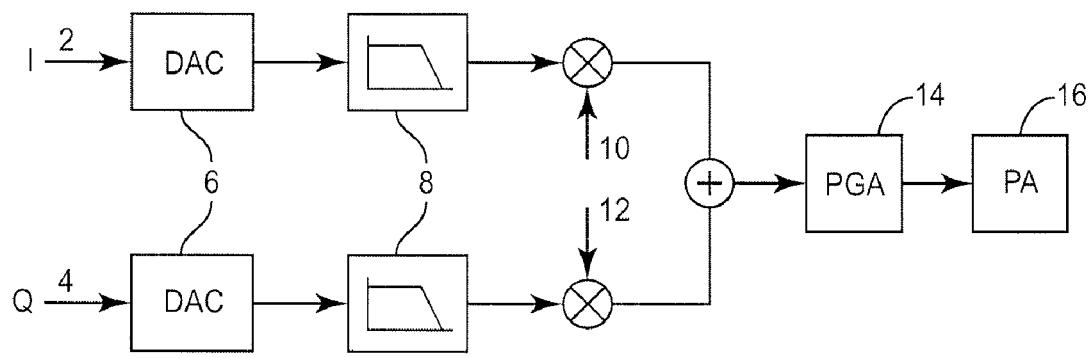
FIG. 1 an embodiment of an IQ transmitter according to prior art,
FIG. 2 an embodiment of a direct digital modulator according to prior art,
FIG. 3 a first embodiment of the digital modulator according to the present application,
FIG. 4 a second embodiment of the digital modulator according to the present application,
FIG. 5 a first exemplified frequency spectrum of a digital modulator according to prior art,
FIG. 6 a first exemplified frequency spectrum of the digital modulator according to the present application,
FIG. 7 a third embodiment of the digital modulator according to the present application,
FIG. 8 a second exemplified frequency spectrum of a digital modulator according to prior art,
FIG. 9 a second exemplified frequency spectrum of the digital modulator according to the present application.
Figure 2:
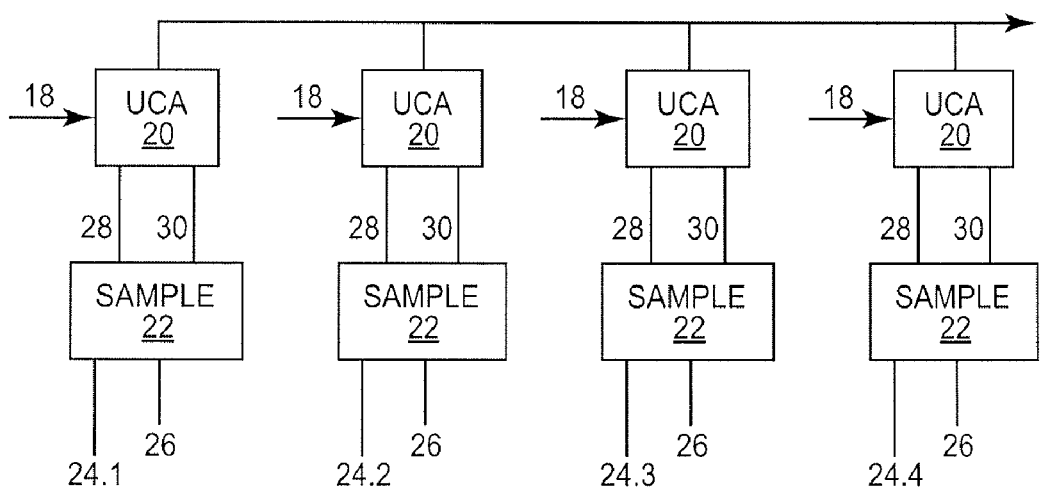
Figure 3:
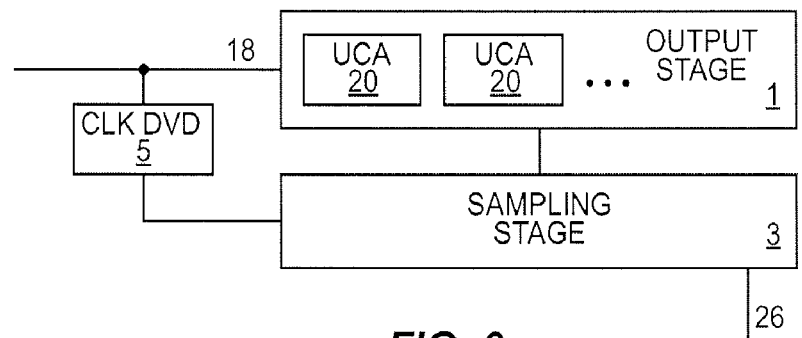

FIG. 3 shows a first simplified embodiment of the digital modulator according to the present application. The digital modulator comprises an output stage 1 with a number N of arranged unit cell arrays 20. A unit cell array 20 may comprise unit cells, which can be arranged in the form of an N×N matrix.

A unit cell may comprise a current source circuit, a local oscillator switching circuit and a data switching circuit. Furthermore, the unit cell may generate an up-converted output signal. A base band signal, preferably a digital base band signal may drive the data switching circuit. The local oscillator switching circuit can be driven by the carrier frequency signal. Moreover, local oscillator switching circuit may be configured for up-converting a digital base band signal to a suitable radio frequency. The provided switching circuits may comprise suitable switching elements, like transistors, which are configured to be conductive or not conductive depending on the polarity or logical values of the local oscillator signal and digital base band signal respectively.

Furthermore, the output stage 1 is connected to a sampling stage 3, which may be configured to oversample a data input signal received via input terminal 26. In addition, a local oscillator signal or carrier frequency signal is supplied to the output stage 1 via terminal 18. A sampling clock generating device 5 is further depicted, which is also connected to the local oscillator (not shown) and to the sampling stage 3. The sampling clock generating device 5 is configured to generate at least one sampling clock signal depending on the local oscillator signal and the carrier frequency signal respectively and the number of arranged unit cell arrays within the output stage 1.

Figure 4:
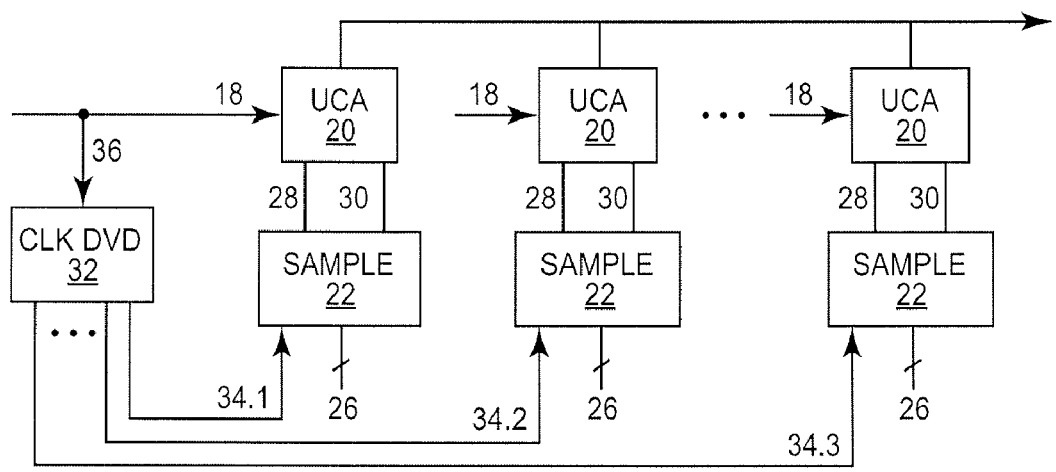

In FIG. 4, a second embodiment of the digital modulator according to the present application is shown. As can be seen from this Figure, a number N of unit cell arrays 20 is arranged as the output stage. The number N of unit cell arrays 20 can be chosen depending on user whishes or system requirements, being elucidated hereinafter.

Each unit cell array 20 may comprise a number of unit cells for up converting input data, like inphase and quadrature information, onto a carrier frequency for transmitting the information. The present unit cell arrays 20 are arranged in parallel to each other. Furthermore, each of the unit cell arrays 20 comprises one output terminal, wherein the output signals can be fed to an output matching network or the like.

In addition, a carrier frequency signal input terminal 18 is provided at each unit cell array 20. A local oscillator (not shown), such as a voltage controlled oscillator (VCO) or the like, generates a suitable local oscillator signal, wherein the frequency depends on the carrier frequency required for a particular transmitting standard. Each of the arranged unit cell arrays 20 may be supplied with the same carrier frequency signal.

Moreover, the unit cell arrays 20 are connected via two lines 28 and 30 to sampling devices 22, wherein the first line 28 may be arranged to drive the rows and the second line 30 may be arranged to drive the columns of the N×N unit cells. It shall be understood that according to further variants of the present application, more or less lines can also be provided. In the shown embodiment, reference sign 28 indicates rows while reference sign 30 indicates the columns.

The sampling device 22 may be formed as a decoding device, such as a binary to thermometer decoder for driving the respective unit cell array 20 in a suitable manner. Also the sampling devices 22 are arranged in parallel to each other and each of the sampling devices 22 is arranged in series to one unit cell array 20. What is more, each of the provided sampling devices 22 comprises two input terminals 26 and 34.

The input terminal 26 may serve as a data input terminal 26. In particular, binary input data can be received by the sampling device 22 via data input terminal 26. The other input terminal 34 may act as sampling clock input terminal 34. Thereby, a first sampling clock signal having a first phase shift can be supplied via terminal 34.1, a second sampling clock signal having a second phase shift can be supplied via terminal 34.2, etc.

These sampling clock signals are generated by a sampling clock generating device 32. This sampling clock generating device 32 may be formed as a dividing unit. In the present embodiment, the sampling clock generating device 32 is formed as a dividing-by-N unit 32 with N being the number of unit cell arrays. The dividing-by-N unit 32 may comprise an input terminal 36, which is connected to the previously mentioned local oscillator device.

The functioning of the present embodiment shown in FIG. 4 will be elucidated in the following. The sampling clock signal or the sampling frequency $f_s$ can be generated by dividing the input carrier frequency LO by the folding factor or the number of arranged unit cell arrays N. In particular, the sampling frequency can be represented by the following equation $$f_s = \frac{f_{LO}}{N}. \quad (a)$$

Moreover, the phase difference $\Delta f$ between the sampling clock signals applied at the different sampling clock input terminals 34.1 to 34.3 of the sampling devices 22 can be determined by equation $$\Delta \varphi = \frac{360}{N}. \quad (b)$$

N being the number of unit cell arrays. From this it follows, that at the first terminal 34.1 the sampling clock signal having a phase shift of 0° can be applied, while at the last terminal 34.3 the sampling clock signal having a phase shift of 360°(N−1)/N can be applied. In other words, the unit cell arrays 20 can be sequentially switched by the applied sampling clock signals. It shall be understood that the particular phase shifts may depend on a chosen start phase.

In the following, an example will point out the advantages of the present digital modulator compared to digital modulators of prior art. In this example, the carrier frequency is set to 1800 MHz, N is set to four and the modulated signal is an orthogonal frequency division multiplex (OFDM) comprising a bandwidth of 20 MHz. For instance, a carrier frequency of 1800 MHz is employed for the GSM 1800 standard. According to prior art the sampling frequency is set to an integer multiple of the bandwidth. In this example, the sampling frequency is set to 400 MHz.

Figure 5:
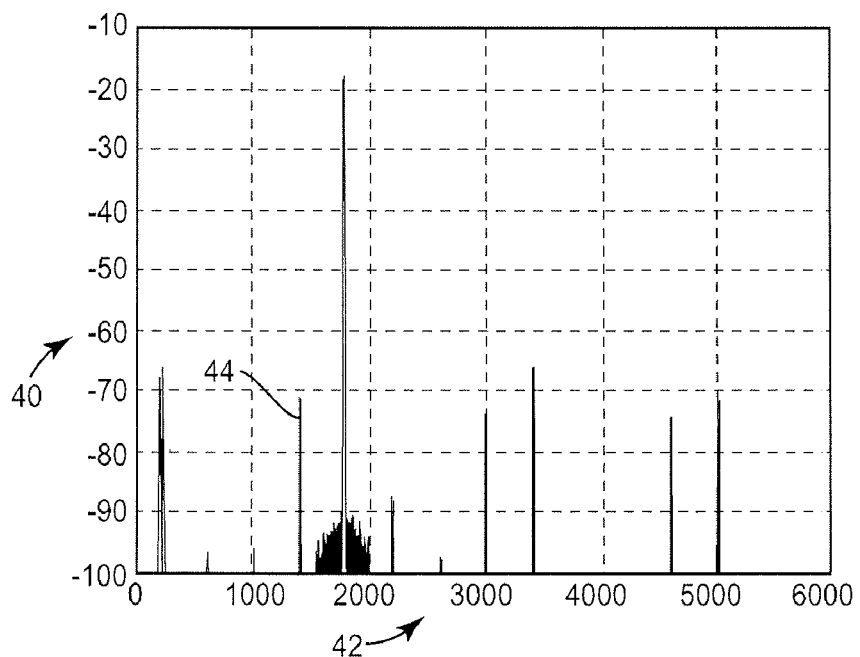

In FIG. 5, a first exemplified frequency spectrum of a digital modulator according to prior art is depicted. Thereby, reference sign 40 indicates the spectrum [dBV/100 kHz], while reference sign 42 indicates the frequency [MHz]. As can be seen from this Figure, the spectrum has its maximum at the carrier frequency. Furthermore, significant peak spurs are located at frequencies equal or greater than 3000 MHz. Since these spurs comprise a distance to the carrier frequency, which is high, the handling of these spurs does not make problems.

However, reference sign 44 indicates a significant peak spur nearby the carrier frequency. This spur 44 is located at approximately 1400 MHz. Furthermore, this spur 44 is caused by the image at the offset of −3200 MHz in the complex domain, which is folded back to 1400 MHz in the real frequency domain, and thus nearby the carrier frequency. According to prior art, this spur 44 can be merely suppressed by using a SAW filter, which requires a large chip area and an expensive production. Otherwise, the harmonic filter would have a very limited attenuation on this spur 44, since it is located closed to the carrier frequency.

Figure 6:
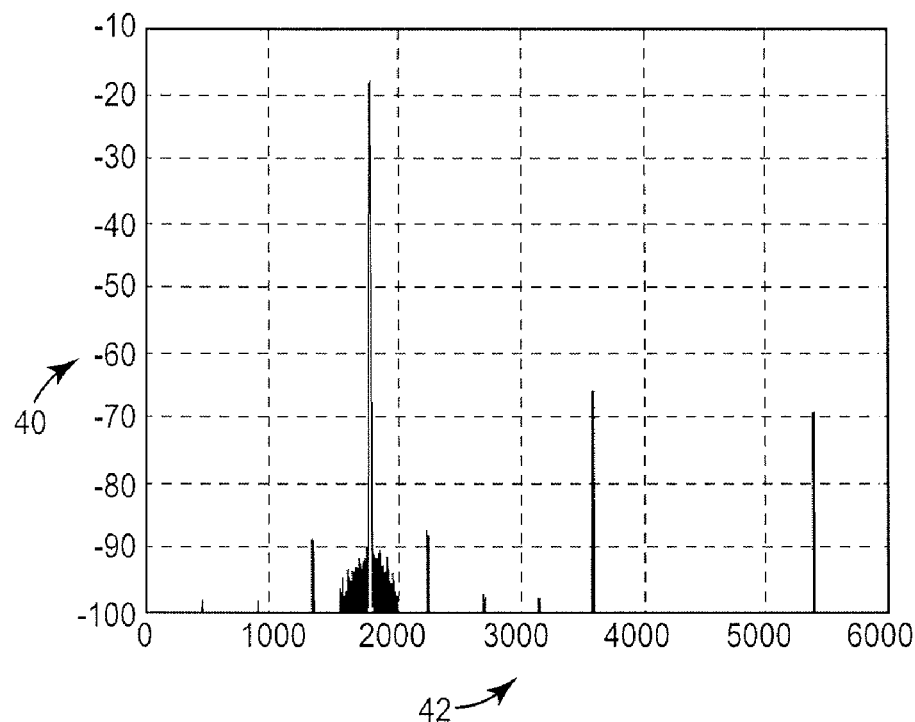

In FIG. 6, a first exemplified frequency spectrum of the digital modulator according to the present application is shown. Using the digital modulator shown in FIG. 4 causes a change of the sampling clock signal or sampling frequency. According to equation a, the sampling frequency can be derived from the carrier frequency. Thus, the sampling frequency for the above stated example is given by $f_s$=1800 MHz/4=450 MHz.

As can be seen from FIG. 6, deriving the sampling clock signal from the carrier frequency signal depending on the number N of folds causes that significant peak spurs nearby the carrier frequency are prevented. In this case, the first peak image is located at −1800 MHz in the complex domain and folded back to DC in the real domain. The second image peak is located at −3600 MHz in the complex domain and folded back to 1800, i.e. the carrier frequency, in the real domain. The employment of a SAW filter can be omitted. Contrary to prior art modulator, the present digital modulator ensures that there are no significant peak spurs nearby the carrier frequency.

Figure 7:
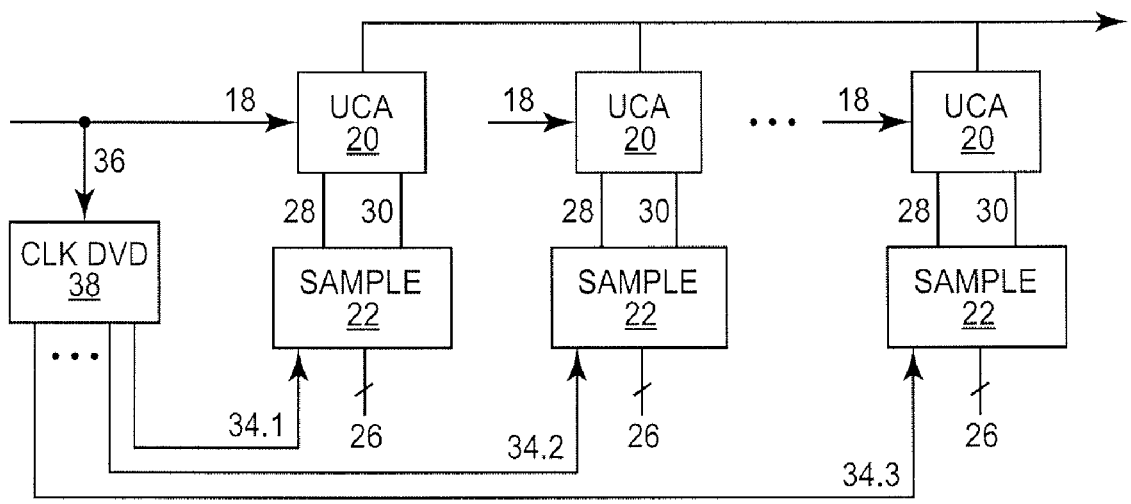

FIG. 7 shows a second embodiment of the digital modulator according to the present application. This second embodiment is similar to the first embodiment shown in FIG. 4. For avoiding repetitions, merely the difference between both embodiments will be pointed out in the following.

The digital modulator of FIG. 7 differs from the digital modulator according to FIG. 4 in that the present sampling clock generating device 38 is formed as a dividing-by-N/2 unit 38. It is found according to the present application that in case N is even the sampling clock signal provided for oversampling the base band signal can be also derived from the carrier frequency by a dividing-by-N/2 unit 38. It shall be noted that the N sampling clocks with 360°/N phase shift can be still achieved due to the present differential configuration.

By the aid of a further example, the functioning of the digital modulator according to FIG. 7 will be elucidated subsequently. As a carrier frequency, a frequency of 700 MHz is chosen (potentially WiMax). Furthermore, N is set to four and the bandwidth of the modulated signal is an OFDM comprising 20 MHz. According to prior art the sampling clock is set to an integer multiple of the bandwidth. In this example, the sampling frequency is set to 400 MHz.

Figure 8:
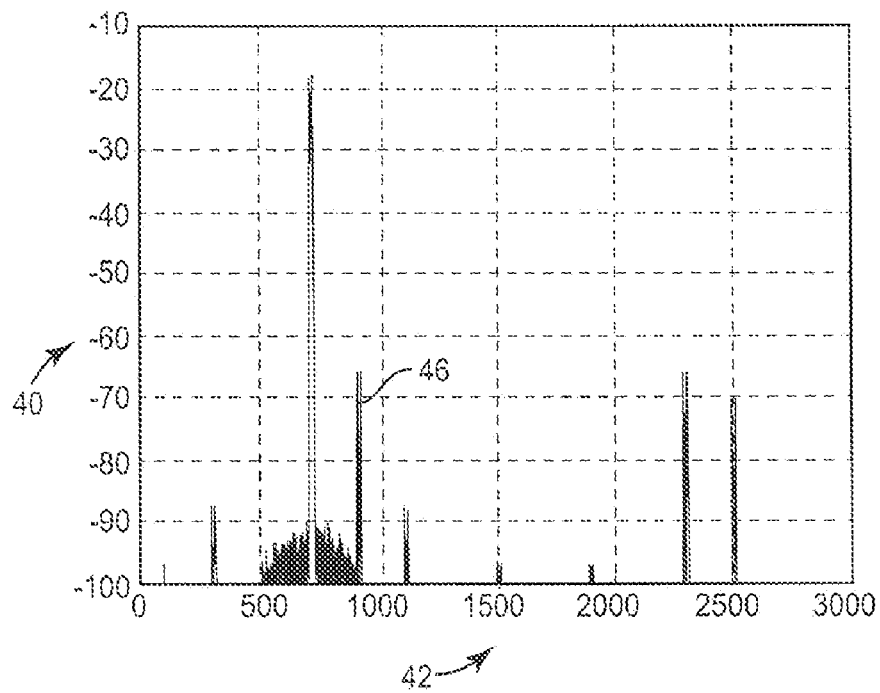

FIG. 8 shows a second exemplified frequency spectrum of a digital modulator according to prior art. Also this spectrum comprises its maximum at the carrier frequency. Furthermore, a significant spur peak 46 is located nearby the carrier frequency at 900 MHz and two further spurs are located at 2.3 GHz and 2.5 GHz. The spur 46 located at 900 MHz corresponds to the −1600 MHz offset. The first significant image spur 46 is located at −900 MHz in the complex frequency domain. This image spur 46 is folded back in real frequency domain to 900 MHz. As mentioned before, this peak spur 46 can be suppressed according to prior art merely by using a suitable SAW filter.

Figure 9:
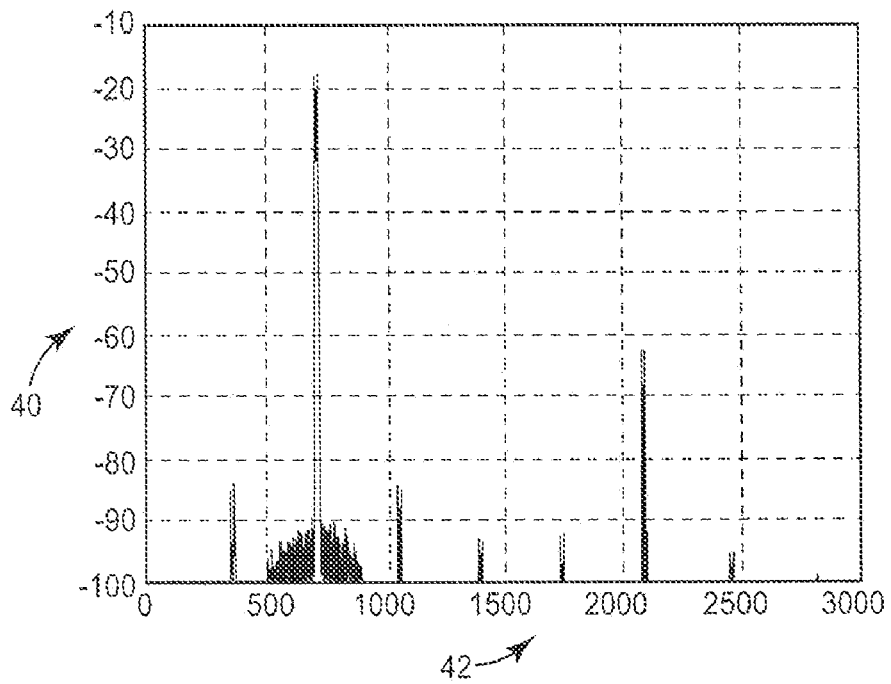

The same example is depicted in FIG. 9, wherein the digital modulator according to FIG. 7 is used instead of a digital modulator according to prior art. In particular, the employment of the dividing-by-N/2 unit 38 causes that the sampling clock or sampling frequency is set 350 MHz. As can be seen from FIG. 9, undesired spurs are not located nearby the carrier frequency. A peak spur is only generated at 2100 MHz, and thus, having a sufficient distance to the carrier frequency.

As mentioned above, the number N of fold used for interpolation or the number N of arranged unit cell arrays 20 may depend on the respective communication system. A wireless communication system, like a mobile phone or the like, may comprise besides a digital modulator for transmitting a receiving device. It may be possible that the bands used by the modulator and receiving device may be different. The number N of fold used for interpolation can be determined depending on the used bands of the transmitting and receiving device. By way of example, a GSM receiver (1.8-1.9 GHz) using a suitable GSM band and a Bluetooth transmitter (2.4-2.5 GHz) comprising the above stated digital modulator may work simultaneously. For preventing peak spurs caused by the digital modulator and located in the band of the GSM receiver, the number N can be adjusted depending on the respective bands. In the above stated example, in case N is four, undesired peaks may occur. In case, the number N is adjusted according to the respective bands, the number N can be set to six resulting in no undesired disturbance. A suitable processing unit can be arranged for adapting the actually used number N in case a plurality of different transmitting devices and receiving devices as is provided within a communication device.

Furthermore, it is readily clear for a person skilled in the art that the logical blocks in the schematic block diagrams algorithm steps presented in the above description may at least partially be implemented in electronic hardware and/or computer software, wherein it depends on the functionality of the logical block and algorithm step and on design constraints imposed on the respective devices to which degree a logical block or algorithm step is implemented in hardware or software. The presented logical blocks and algorithm steps may for instance be implemented in one or more digital signal processors, application specific integrated circuits, field programmable gate arrays or other programmable devices. The computer software may be stored in a variety of storage media of electric, magnetic, electro-magnetic or optic type and may be read and executed by a processor, such as for instance a microprocessor. To this end, the processor and the storage medium may be coupled to interchange information, or the storage medium may be included in the processor.

The invention claimed is:

1. A digital modulator, comprising:
an output stage comprising a plurality of unit cell arrays, and having at least one carrier frequency signal input terminal configured to receive a carrier frequency signal;
a sampling stage connectable to the output stage, the sampling stage configured to oversample at least one data input signal; and
at least one sampling clock generating device configured to generate at least one sampling clock signal based on a number (N) of arranged unit cell arrays and the carrier frequency signal.

2. The digital modulator of claim 1 wherein the unit cell arrays are arranged in the output stage in parallel.

3. The digital modulator of claim 1 wherein the sampling stage comprises a plurality of sampling devices, each connected to one of the unit cell arrays.

4. The digital modulator of claim 3 wherein the sampling device comprises a decoding device.

5. The digital modulator of claim 1 wherein the sampling clock generating device comprises a dividing device.

6. The digital modulator of claim 1 wherein the sampling clock generating device comprises at least one dividing factor.

7. The digital modulator of claim 6 wherein the dividing factor of the sampling clock generating device is selected from the group including the number (N) of arranged unit cell arrays, and half the number (N) of arranged unit cell arrays.

8. The digital modulator of claim 1 wherein the sampling clock generating device comprises at least one phase shifting unit configured to generate sampling clock signals comprising a phase shift based on a ratio of 360 degrees to the number (N) of arranged unit cell arrays.

9. The digital modulator of claim 1 wherein each unit cell array comprises N×N unit cells.

10. The digital modulator of claim 1 wherein the digital modulator is implemented in a technology selected from the group including CMOS, bipolar, BiCMOS, GaAs, and a combination thereof.

11. The digital modulator of claim 10 wherein the digital modulator is implemented as a discrete device.

12. A communication device comprising:
a digital modulator, the digital modulator comprising
an output stage comprising a plurality of unit cell arrays, and having at least one carrier frequency signal input terminal configured to receive a carrier frequency signal;
a sampling stage connectable to the output stage, the sampling stage configured to oversample at least one data input signal; and
at least one sampling clock generating device configured to generate at least one sampling clock signal based on a number (N) of arranged unit cell arrays and the carrier frequency signal.

13. The communication device of claim 12, further comprising at least one receiving device.

14. The communication device of claim 13 wherein a number (N) of arranged unit cell arrays of the digital modulator depends on at least one predefined criterion.

15. The communication device of claim 14 wherein the at least one predefined criterion comprises one of the frequency band used by at least one receiving device and the frequency band used by the digital modulator.

16. A method for digitally modulating a signal in a digital modulator including a number (N) of unit cell arrays arranged within an output stage, comprising:
receiving at least two data input signals;
oversampling the data input signals using at least two sampling clock signals;
interpolating the oversampled signals by the number (N) of unit cell arrays;
up converting the oversampled signals by the output stage using a carrier frequency signal; and
generating the sampling clock signals based on the carrier frequency signal and the number (N) of unit cell arrays.

17. A computer readable medium including computer program logic stored thereon, the computer program logic operative to cause a processor to control a digital modulator, including a number (N) of unit cell arrays arranged within an output stage, to perform the steps of:
receiving at least two data input signals;
oversampling the data input signals using at least two sampling clock signals;
interpolating the oversampled signals by the number (N) of unit cell arrays;
up converting the oversampled signals by the output stage using a carrier frequency signal; and
generating the sampling clock signals based on the carrier frequency signal and the number (N) of unit cell arrays.

* * * * *